United States Patent
Ro et al.

(10) Patent No.: US 9,122,117 B2
(45) Date of Patent: Sep. 1, 2015

(54) LIQUID CRYSTAL DISPLAY

(71) Applicant: Samsung Display Co., Ltd., Yongin (KR)

(72) Inventors: Sung In Ro, Hwaseong-si (KR); Seung Hyun Park, Seoul (KR); Hyang Yul Kim, Hwaseong-si (KR); Jae Hak Lee, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/213,506

(22) Filed: Mar. 14, 2014

(65) Prior Publication Data

US 2014/0267967 A1   Sep. 18, 2014

(30) Foreign Application Priority Data

Mar. 15, 2013   (KR) .................. 10-2013-0027890

(51) Int. Cl.
   *G09G 3/36* (2006.01)
   *G02F 1/1362* (2006.01)
   *G01R 13/40* (2006.01)

(52) U.S. Cl.
   CPC ........ *G02F 1/136286* (2013.01); *G01R 13/405* (2013.01); *G02F 1/136213* (2013.01); *G09G 3/3648* (2013.01); *G09G 3/3688* (2013.01); *G02F 2201/123* (2013.01)

(58) Field of Classification Search
   None
   See application file for complete search history.

(56) References Cited

U.S. PATENT DOCUMENTS

| | | | |
|---|---|---|---|
| 6,075,507 A | 6/2000 | Miyahara et al. | |
| 6,864,883 B2 | 3/2005 | Hector et al. | |
| 7,759,627 B2 | 7/2010 | Kunimori et al. | |
| 8,848,142 B2 * | 9/2014 | Park et al. | 349/110 |
| 2004/0124414 A1 * | 7/2004 | Jang et al. | 257/59 |
| 2008/0013009 A1 | 1/2008 | Inada | |
| 2010/0321601 A1 * | 12/2010 | Gao et al. | 349/42 |
| 2011/0221727 A1 | 9/2011 | Kim et al. | |
| 2011/0221983 A1 | 9/2011 | Lee | |
| 2011/0227955 A1 | 9/2011 | Lee et al. | |

FOREIGN PATENT DOCUMENTS

| | | |
|---|---|---|
| JP | 3986362 | 7/2007 |
| KR | 1020020071995 | 9/2002 |
| KR | 100717183 | 5/2007 |
| KR | 1020110078986 | 7/2011 |

* cited by examiner

*Primary Examiner* — Muhammad N Edun
(74) *Attorney, Agent, or Firm* — Cantor Colburn LLP (57) ABSTRACT

A liquid crystal display includes: a display area including: a first data line between a first pixel electrode and a second pixel electrode in a same pixel row, and connected to a first thin film transistor ("TFT") and a second TFT, respectively; and a peripheral area including: a first parasitic capacitor capacity measuring unit including first gate capacity units and first data capacity units; a second parasitic capacitor capacity measuring unit including second gate capacity units and second data capacity units, where a relative arrangement between the first gate and data capacity units is the same as a relative arrangement between the gate and drain electrodes of the first TFT, and a relative arrangement between the second gate and data capacity units is the same as a relative arrangement between the gate and drain electrodes of the second TFT.

16 Claims, 6 Drawing Sheets

LIQUID CRYSTAL DISPLAY

This application claims priority to Korean Patent Application No. 10-2013-0027890 filed on Mar. 15, 2013, and all the benefits accruing therefrom under 35 U.S.C. §119, the content of which in its entirety is herein incorporated by reference.

BACKGROUND (a) Field

Exemplary embodiments of the invention relate to a liquid crystal display.

(b) Description of the Related Art

A liquid crystal display ("LCD") is one of the most widely used types of flat panel display, and the LCD display images by applying voltages to field-generating electrodes to generate an electric field in a liquid crystal ("LC") layer that determines orientations of LC molecules therein to adjust polarization of incident light.

The display device typically includes pixels arranged in a matrix form, and each pixel includes a pixel electrode, a common electrode and a thin film transistor as a switching element that is connected to a corresponding pixel electrode. The thin film transistor is connected to a gate line that transfers a gate signal generated by a gate driver and a data line that transfers a data signal generated by a data driver, and the thin film transistor transfers the data signal to the pixel electrode or blocks the signal based on the gate signal.

In the LCD, an electric field is generated in a liquid crystal layer by applying a voltage to the pixel electrode and the common electrode, and a polarity of the data voltage with respect to the common voltage may be inverted every frame, every row, or every pixel to effectively prevent a degradation phenomenon generated by applying the electric field in one direction to the liquid crystal layer for a long time.

The gate driver and the data driver of the display device generally include a plurality of driver integrated circuit ("IC") chips, which is typically more expensive than the gate driving circuit chip.

In the connection relationship between the data line and pixel, arrangements of the source electrode and drain electrode of the thin film transistor of a plurality of pixels disposed in the same pixel row or the same pixel column may be different from each other, and the misalignment in the arrangements of the source electrode and drain electrode of the thin film transistor may occur in the manufacturing step of the thin film transistor array panel.

SUMMARY

Exemplary embodiments of the invention relate to a liquid crystal display with improved display quality by removing a stain of a thin longitudinal stripe shape that may occur by a deviation of a structure and a position of a thin film transistor in each pixel.

An exemplary embodiment of a liquid crystal display according to the invention includes a display area and a peripheral area. In such an embodiment, the display area includes: a plurality of pixel electrodes arranged substantially in a matrix form including a plurality of pixel rows and a plurality of pixel columns; a plurality of data lines extending substantially in a pixel column direction, where each data line is disposed between two adjacent pixel columns; and a plurality of gate lines extending substantially in a pixel row direction, where the gate lines are in two-to-one correspondence with the pixel rows, where a first data line of the data lines is disposed between a first pixel electrode and a second pixel electrode of the pixel electrodes, where the first pixel electrode and the second pixel electrode are disposed in a same pixel row between a first gate line and a second gate line of the gate lines, which are adjacent to each other, where the first pixel electrode is connected to a first thin film transistor including a first source electrode connected to the first data line, a first drain electrode opposite to the first source electrode, and a first gate electrode, and where the second pixel electrode is connected to a second thin film transistor including a second source electrode connected to the first data line, a second drain electrode opposite to the second source electrode, and a second gate electrode, and in such an embodiment, the peripheral area includes: a first parasitic capacitor capacity measuring unit including a plurality of first gate capacity units and a plurality of first data capacity units; and a second parasitic capacitor capacity measuring unit including a plurality of second gate capacity units and a plurality of second data capacity units, where a relative arrangement between the first gate capacity units and the first data capacity units is substantially the same as a relative arrangement between the first gate electrode and the first drain electrode, and where a relative arrangement between the second gate capacity units and the second data capacity units is substantially the same as a relative arrangement between the second gate electrode and the second drain electrode.

In an exemplary embodiment, the first gate capacity units and the second gate capacity units may be disposed in a same layer as the gate line, and the first data capacity units and the second data capacity units may be disposed in a same layer as the data line.

In an exemplary embodiment, a first gate signal may be applied to the first gate electrode, a second gate signal may be applied to the second gate electrode, and a first voltage difference between a maximum gate voltage and a minimum gate voltage of the first gate signal at the time when the voltage level of the first gate signal is changed from a gate-on voltage to a gate-off voltage may be different from a second voltage difference between a maximum gate voltage and a minimum gate voltage of the second gate signal at the time when the voltage level of the second gate signal is changed from the gate-on voltage to the gate-off voltage.

In an exemplary embodiment, the voltage level of the gate-on voltage of the first gate signal at the time when the voltage level of the first gate signal is changed from the gate-off voltage to the gate-on voltage may be substantially the same as the voltage level of the gate-on voltage of the second gate signal at the time when the voltage level of the second gate signal is changed from the gate-off voltage to the gate-on voltage.

In an exemplary embodiment, the first gate electrode and the second gate electrode may be connected to the first gate line and the second gate line, respectively.

In an exemplary embodiment, when the magnitude of a first parasitic capacitance measured at the first parasitic capacitor capacity measuring unit is greater than the magnitude of a second parasitic capacitance measured at the second parasitic capacitor capacity measuring unit, the first voltage difference of the first gate signal applied to the first gate electrode may be set to be less than the second voltage difference of the second gate signal applied to the second gate electrode.

In an exemplary embodiment, when the first parasitic capacitance measured at the first parasitic capacitor capacity measuring unit is less than the second parasitic capacitance measured at the second parasitic capacitor capacity measuring unit, the first voltage difference of the first gate signal applied to the first gate electrode may be set to be greater than the second voltage difference of the second gate signal applied to the second gate electrode.

In exemplary embodiments of the liquid crystal display according to the invention, each data line is disposed two adjacent pixel columns and connected to pixels in the two adjacent pixel columns positioned at the left side and the right side thereof, thereby substantially reducing the number of wires corresponding to the data lines. In such embodiments, the parasitic capacitance measuring unit is included and the parasitic capacitance difference between the gate conductor and the data conductor in the pixel column disposed at the left side of a data line and the gate conductor and the data conductor in the pixel column disposed at the right side of the data line occurs is determined. In such embodiments, by decreasing the voltage difference between the gate-on voltage and the gate-off voltage in the gate voltage that is applied to a pixel column having the relatively large parasitic capacitance, the change of the kick-back voltage due to the different parasitic capacitances in the pixel columns is effectively prevented to remove the kick-back voltage difference in the pixel columns, thereby effectively preventing the display quality deterioration such as the longitudinal blur or line due to the kick-back voltage difference.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION OF THE EMBODIMENTS

The invention will be described more fully hereinafter with reference to the accompanying drawings, in which exemplary embodiments of the invention are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer, the element or layer can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, exemplary embodiments of the invention will be described in further detail with reference to the accompanying drawings.

Now, an exemplary embodiment of a liquid crystal display according to the invention will be described with reference to drawings.

Figure 1:
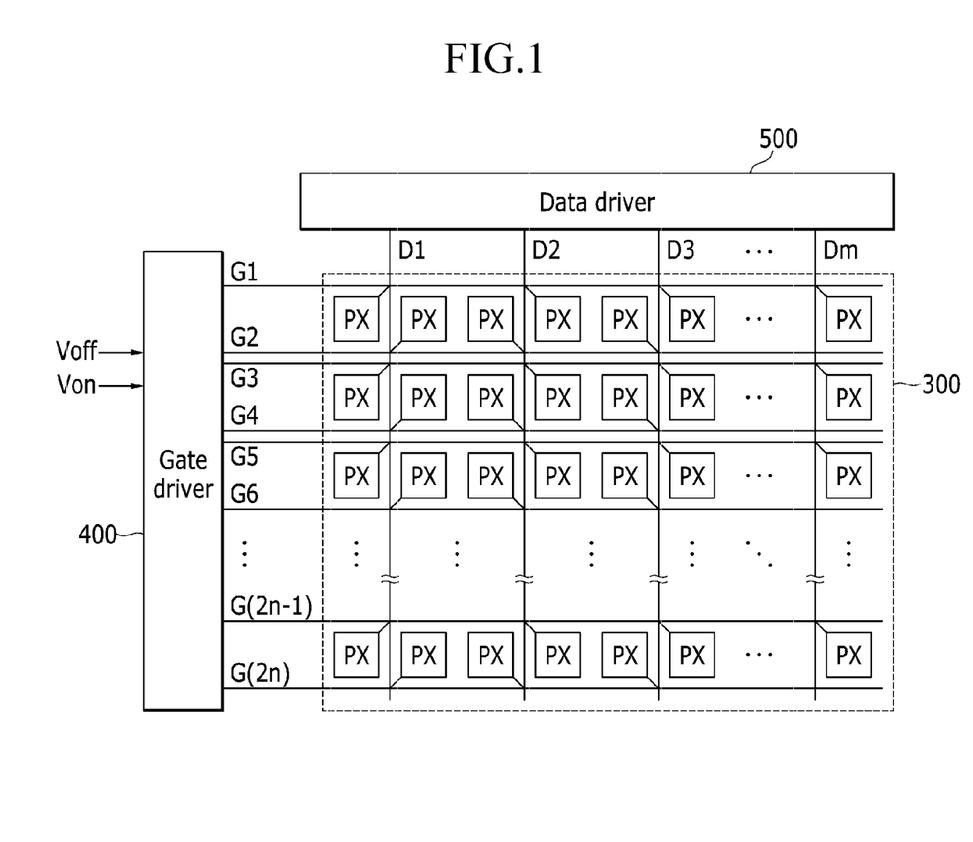
FIG. 1 is a block diagram showing an exemplary embodiment of a liquid crystal display according to the invention.

FIG. 1 is a block diagram showing an exemplary embodiment of a liquid crystal display according to the invention.

Referring to FIG. 1, an exemplary embodiment of a display device according to the invention includes a display panel assembly 300, and a gate driver 400 and a data driver 500, which are connected to the display panel assembly 300.

The display panel assembly 300 includes a plurality of display signal lines G1 to G(2n) and D1 to Dm, and a plurality of pixels PX that are connected to the display signal lines G1 to G(2n) and D1 to Dm and arranged substantially in a matrix form.

In an exemplary embodiment, each pixel PX uniquely displays one of three primary colors to display a color image, and the color image is recognized by a spatial or temporal sum of the primary colors. In one exemplary embodiment, for example, the primary colors are three primary colors of red, green and blue, for example.

The display signal lines G1 to G(2n) and D1 to Dm include a plurality of gate lines G1 to G(2n) for transmitting gate signals (referred to as "scanning signals") and a plurality of data lines D1 to Dm for transmitting a data voltage. The gate lines G1 to G(2n) are arranged substantially parallel to each other and extend substantially in a pixel row direction, and the data lines D1 to Dm are arranged substantially parallel to each other and extend substantially in a pixel column direction. The display signal lines G1 to G(2n) and D1 to Dm may be disposed on a thin film transistor array panel included in the display panel assembly 300.

Each pixel PX includes a pixel electrode (not shown) that receives a data signal through a switching element (not shown) such as the thin film transistor connected to the gate lines G1 to G(2n) and the data lines D1 to Dm, and a common electrode (not shown) disposed opposite to the pixel electrode and receiving a common voltage.

In an exemplary embodiment, each pixel PX is disposed between one of a pair of gate lines G1 and G2, G3 and G4, . . . , G(2n−1) and G(2n) such that the pixels PX of a same pixel row are connected to one of the pair of gate lines G1 and G2, G3 and G4, . . . , G(2n−1) and G(2n) that neighbor each other in the pixel column direction.

In an exemplary embodiment, each of the data lines D1 to Dm is disposed every two pixel columns. In such an embodiment, one data line may be disposed between a pair of pixel columns, the pixels PX of odd-numbered pixel columns are connected to the data lines D1 to Dm directly neighboring at the right side thereof through the switching elements, and the pixels PX of the even-numbered pixel columns are connected to the data lines D1 to Dm directly neighboring at the left side thereof through the switching elements.

The gate driver 400 is connected to the gate lines G1 to G(2n) of the display panel assembly 300 to apply a gate signal including a gate-on voltage Von for turning on the switching element and a gate-off voltage Voff for turning off the switching element to the gate lines G1 to G(2n).

The data driver 500 is connected to the data lines D1 to Dm of the display panel assembly 300, and applies the data voltage to the data lines D1 to Dm.

The connection relationship between the pixels PX disposed on the same pixel column, and the gate and data lines G1 to G(2n) and D1 to Dm may be substantially the same as each other.

The connection relationship between the pixels and display signal lines G1 to G(2n) and D1 to Dm in an exemplary embodiment is illustrated in FIG. 1, but not being limited thereto, and the connection relationship and disposition may be modified in an alternative exemplary embodiment.

Next, a display area of a liquid crystal display according to an exemplary embodiment of the invention will be described with reference to FIG. 2 and FIG. 3.

Figure 2:
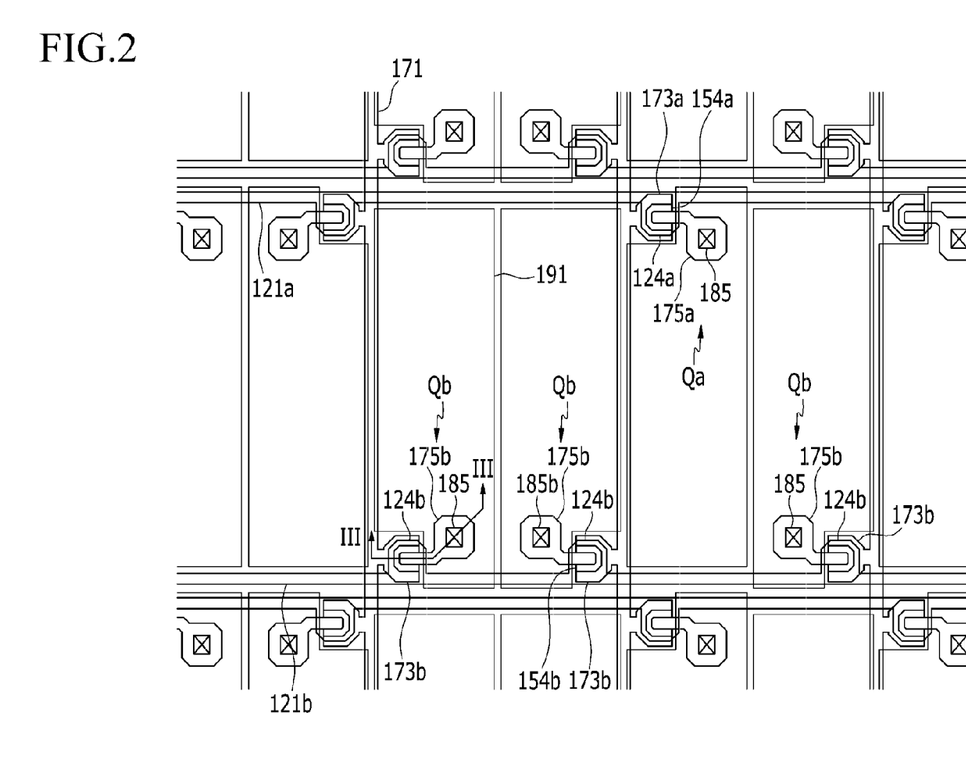
FIG. 2 is a top plan view of a portion of pixels of an exemplary embodiment of a liquid crystal display according to the invention.
Figure 3:
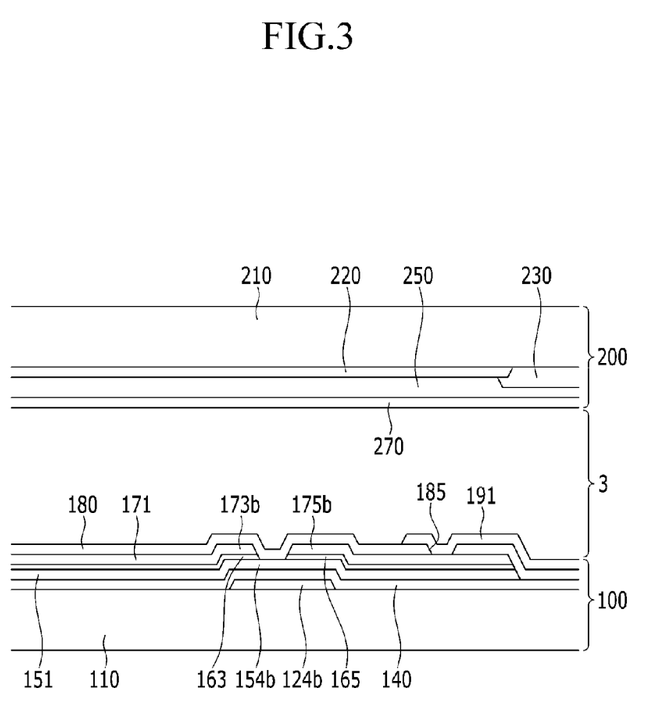
FIG. 3 is a cross-sectional view taken along line III-III of FIG. 2.

FIG. 2 is a top plan view of a portion of the pixel of an exemplary embodiment of a liquid crystal display according to the invention, and FIG. 3 is a cross-sectional view taken along line III-III of FIG. 2.

Referring to FIG. 2 and FIG. 3, an exemplary embodiment of the liquid crystal display includes a thin film transistor array panel 100 and a common electrode panel 200 disposed opposite to the thin film transistor array panel 100, and a liquid crystal layer 3 interposed between the thin film transistor array panels 100 and the common electrode panel 200.

Firstly, the common electrode panel 200 includes an insulation substrate 210, and the common electrode panel 200 includes a light blocking member 220 and a plurality of color filters 230, which are disposed on the insulation substrate 210. Each color filter 230 may represent one of primary colors, such as three primary colors of red, green and blue, for example. At least one of the color filter 230 and the light blocking member 220 may be disposed in the thin film transistor array panel 100.

An overcoat 250 is disposed on the color filter 230 and the light blocking member 220, and a common electrode 270 that receives a common voltage is disposed on the overcoat 250.

Next, the thin film transistor array panel 100 includes an insulation substrate 110, and the thin film transistor array panel 100 includes a plurality of gate conductors including a plurality of first gate lines 121a and second gate lines 121b, which are disposed on an insulation substrate 110.

The first gate line 121a and the second gate lines 121b transmit gate signals, extend substantially in the pixel row direction, and are alternately disposed in the pixel column direction. The first gate line 121a and the second gate line 121b disposed below the first gate line 121a form a pair, and the first gate line 121a is closer to the second gate line 121b of a neighboring pair disposed thereabove than the second gate line 121b disposed therebelow.

The first gate lines 121a include a plurality of first gate electrodes 124a that protrudes downward. The second gate lines 121b include a plurality of second gate electrodes 124b that protrudes upward.

A gate insulating layer 140 including silicon nitride (SiNx) or silicon oxide (SiOx) is disposed on the gate conductors 121a and 121b, and a plurality of semiconductors 151 that includes hydrogenated amorphous silicon ("a-Si") or polysilicon are disposed on the gate insulating layer 140.

The semiconductors 151 substantially extend in the pixel column direction, and include a plurality of first semiconductor connections and a plurality of first semiconductors 154a that protrude from a portion extending in the pixel column direction toward the first gate electrode 124a or the second gate electrode 124b.

A plurality of ohmic contacts, e.g., a first ohmic contact 163 and a second ohmic contact 165, is disposed on the semiconductors 151. The first ohmic contact 163 and the second ohmic contact 165 are opposite to each other with respect to the first or second gate electrodes 124a or 124b, and are arranged as a pair on the first or second semiconductors 154a or 154b.

In an exemplary embodiment, the semiconductor 151 may include an oxide semiconductor. In such an embodiment, where the semiconductor 151 includes the oxide semiconductor, the ohmic contacts 163 and 165 may be omitted.

A data conductor including a plurality of data lines 171 and a plurality of drain electrodes 175a and 175b is disposed on the ohmic contacts 163 and 165 and the gate insulating layer 140.

The data lines 171 transmit the data signal and extend substantially in the pixel column direction, thereby crossing the first and second gate lines 121a and 121b. Each data line 171 includes a plurality of first source electrodes 173a and a plurality of second source electrodes 173b, which extend toward the first gate electrode 124a and the second gate electrode 124b, respectively, from a portion extending in the pixel column direction.

The drain electrode includes the first drain electrode 175a and the second drain electrode 175b opposite to the first source electrode 173a and the second source electrode 173b, respectively, with respect to the first gate electrode 124a or the second gate electrode 124b.

The first gate electrode 124a, the first source electrode 173a and the first drain electrode 175a collectively define a first thin film transistor Qa along with the first semiconductor 154a, and the second gate electrode 124b, the second source electrode 173b and the second drain electrode 175b collectively define a second thin film transistor Qb along with the second semiconductor 154b. The first thin film transistor Qa is disposed at the right side with respect to the data line 171, and the second thin film transistor Qb is disposed at the left side with respect to the data line 171. The channel of the first and second thin film transistors Qa and Qb is formed in the first and second semiconductors 154a and 154b between the first source electrode 173a and the first drain electrode 175a and between the second source electrode 173b and the second drain electrode 175b, respectively.

In an exemplary embodiment, the gate conductors including the first gate lines 121a and the second gate lines 121b, and the data conductors including the data lines 171 and the first and second drain electrodes 175a and 175b may be provided, e.g., formed, by depositing a corresponding conductive material on the insulation substrate 110 and patterning the deposited conductive material by photolithography. In an exemplary embodiment, the semiconductors 151 and the first and second ohmic contacts 163 and 165 may be provided by the same process for providing the data conductor 171, 175a and 175b through the photolithography process using a same photomask.

In an alternative exemplary embodiment, the gate conductors 121a and 121b and the data conductors 171, 175a and 175b may be provided through different processes such that an alignment error may be generated between the gate conductors 121a and 121b and the data conductors 171 and 175 when the photomask for exposing the photosensitive film is not aligned at substantially the same predetermined position. In such an embodiment, when the alignment error in the right and left directions is generated between the gate conductors 121a and 121b and the data conductors 171, 175a and 175b such that the data conductors 171 and 175 are moved to the right or left side from the predetermined position with respect to the gate conductors 121a and 121b, an overlapping area between the first drain electrode 175a and the first gate electrode 124a or between the second drain electrode 175b and the second gate electrode 124b is changed.

In such an embodiment, when the overlapping area between the first drain electrode 175a and the first gate electrode 124a or between the second drain electrode 175b and the second gate electrode 124b is changed, capacitance of a parasitic capacitor Cgd between the first drain electrode 175a and the first gate electrode 124a or between the second drain electrode 175b and the second gate electrode 124b is changed in a pixel column. In such an embodiment, when the capacitance change of the parasitic capacitor is generated in a pixel column, the display quality deterioration such as the longitude stripes may occur.

The first and second ohmic contacts 163 and 165 are interposed only between the semiconductor 151 disposed therebelow and the data conductors 171, 175a and 175b disposed thereon, and reduce contact resistance between the semiconductor 151 and the and the data conductors 171, 175a and 175b. The semiconductor 151 include portions that are exposed by the data conductors 171, 175a and 175b, and portions between the first source electrode 173a and the first drain electrode 175a and between the second source electrode 173b and the second drain electrode 175b.

A passivation layer 180 is disposed on the data conductors 171 and 175 and the exposed portion of the semiconductor 151. A plurality of contact holes 185 exposing the expansions of the drain electrodes 175 is defined in the passivation layer 180.

A plurality of pixel electrodes 191 is disposed on the passivation layer 180. The pixel electrodes 191 may include a transparent conductive material such as indium tin oxide ("ITO") or indium zinc oxide ("IZO"), for example, or a reflective metal such as aluminum, silver, chromium, or alloys thereof, for example.

The pixel electrodes 191 are physically and electrically connected to the first and second drain electrodes 175a and 175b through the contact holes 185, and are applied with data voltages from the first and second drain electrodes 175a and 175b. The pixel electrodes 191 that receive the data voltages generate an electric field along with the common electrode 270 of the common electrode panel 200, which determines the orientations of the liquid crystal molecules of the liquid crystal layer 3 disposed between the pixel and common electrodes 191 and 270. Accordingly, the polarization of the light transmitted through the liquid crystal layer 3 changes based on the determined orientation of the liquid crystal molecules. The pixel electrode 191 and the common electrode 270 form a liquid crystal capacitor along with the liquid crystal layer 3 therebetween and maintain the applied voltage after the first and second thin film transistors Qa and Qb are turned off.

Figure 4A:
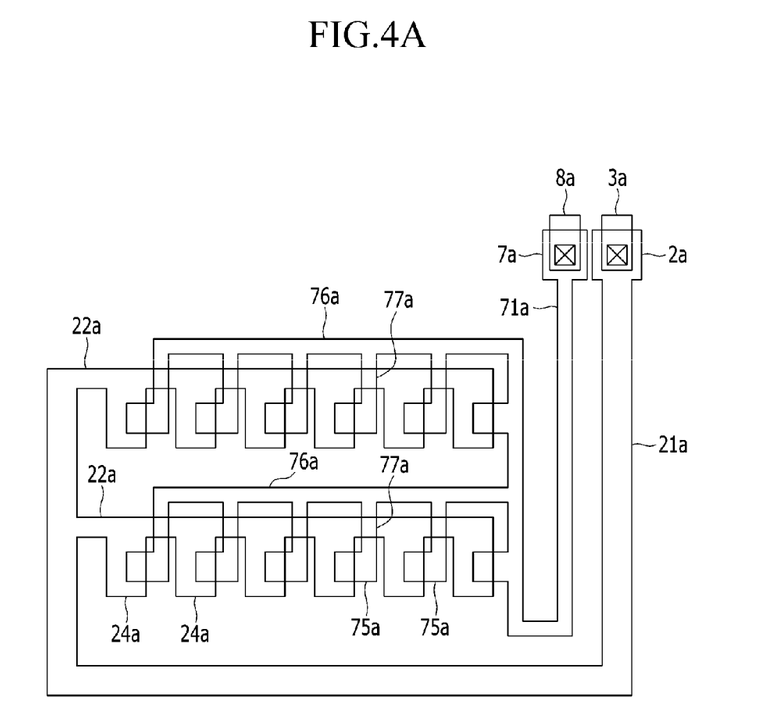
FIG. 4A and FIG. 4B are views of a portion of an exemplary embodiment of a liquid crystal display according to the invention.
Figure 4B:
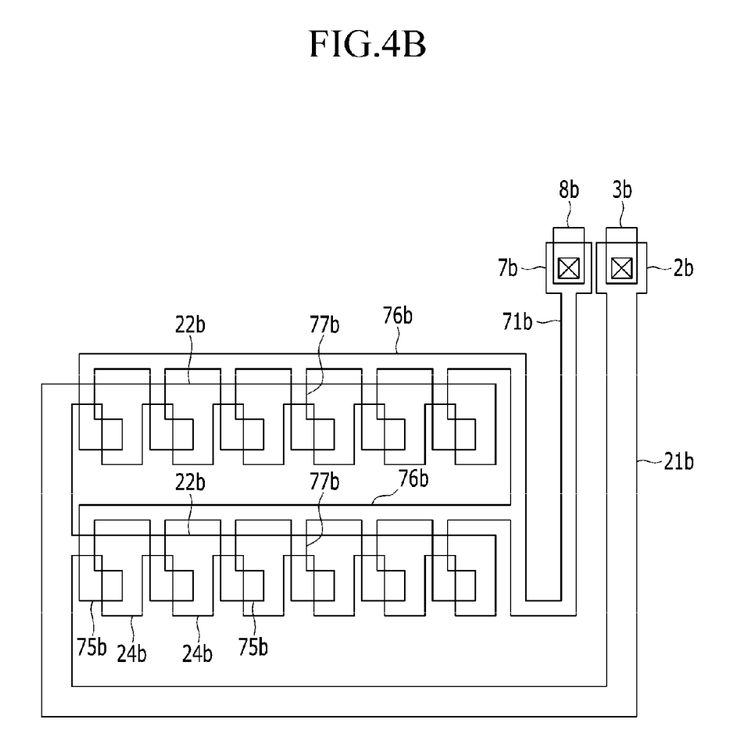

Next, an exemplary embodiment of a capacitance measuring unit of a parasitic capacitor Cgd disposed in a peripheral area of a liquid crystal display according to the invention will be described with reference FIG. 4A and FIG. 4B. FIG. 4A and FIG. 4B are views of a portion of an exemplary embodiment of a liquid crystal display according to the invention.

In an exemplary embodiment, the liquid crystal display includes a display area, in which a plurality of pixels PX is disposed, and a peripheral area outside the display area.

In an exemplary embodiment, a first parasitic capacitor capacity measuring unit and a second parasitic capacitor capacity measuring unit are disposed in the peripheral area.

Referring to FIG. 4A, the first parasitic capacitor capacity measuring unit will now be described.

Referring to FIG. 4A, an exemplary embodiment of the first parasitic capacitance measuring unit of the liquid crystal display according to the invention includes a first gate signal wiring 21a including a plurality of first gate capacity units 24a, which is disposed in a same layer as the first and second gate lines 121a and 121b of the display area, and the gate insulating layer 140 is disposed on the first gate signal wiring 21a. In such an embodiment, the first gate signal wiring 21a may correspond to the first and second gate lines 121a and 121b of the display area, and may be provided in the peripheral area by the same process as the first and second gate lines 121a and 121b of the display area, e.g., using a same mask at the same time.

The first gate signal wiring 21a includes a plurality of first transverse portions 22a, and a plurality of first gate capacity units 24a that extends downward from the first transverse portion 22a.

In such an embodiment, a first data signal wiring 71a including a plurality of first data capacity units 75a is disposed on the gate insulating layer 140. The first data signal wiring 71a includes a plurality of second transverse portions 76a and a plurality of first longitudinal portions 77a extending from the second transverse portions 76a. The first data capacity units 75a extend from the first longitudinal portions 77a to the left side. In such an embodiment, the first data signal wiring 71a may correspond to the data lines 171 of the display area, and may be provided in the peripheral area by the same process as the data lines 171 of the display area, e.g., using a same mask at the same time.

The first gate capacity units 24a and the first data capacity units 75a respectively overlap each other via the gate insulating layer 140, each of the first data capacity units 75a is disposed at the right side of a corresponding first gate capacity unit 24a. In such an embodiment, a relative arrangement between the first gate capacity units 24a and the first data capacity units 75a of the first parasitic capacitance measuring unit is substantially similar to the relative arrangement between the gate electrodes 124a and 124b and the drain electrodes 175a and 175b of the thin film transistor of even-numbered pixel columns of the liquid crystal display.

The first gate signal wiring 21a and the first data signal wiring 71a include extending end portions 2a and 7b, and connecting members 3a and 8a to be connected to an external measuring tag are disposed on the extending ends 2a and 7a of the first gate signal wiring 21a and the first data signal wiring 71a.

Next, referring to FIG. 4B, the second parasitic capacitor capacity measuring unit will now be described.

Referring to FIG. 4B, an exemplary embodiment of the second parasitic capacitance measuring unit of the liquid crystal display according to the invention includes a second gate signal wiring 21b including a plurality of second gate capacity units 24b disposed in the same layer as the gate conductors 121a and 121b of the display area, and the gate insulating layer 140 is disposed on the second gate signal wiring 21b.

The second gate signal wiring 21b includes a plurality of third transverse portions 22b, and a plurality of second gate capacity units 24b that extends downward from the third transverse portions 22b.

The second data signal wiring 71b including a plurality of second data capacity units 75b is disposed on the gate insulating layer 140. The second data signal wiring 71b includes a plurality of fourth transverse portions 76b and a plurality of second longitudinal portions 77b that extends from the fourth transverse portions 76b. The second data capacity units 75b extend from the second longitudinal portions 77b to the right side.

The second gate capacity units 24b and the second data capacity units 75b respectively overlap each other via the gate insulating layer 140, and the second data capacity units 75b are disposed at the left side of the second gate capacity units 24b. Accordingly, a relative arrangement of the second gate capacity units 24b and the second data capacity units 75b of the second parasitic capacitance measuring unit is substantially similar to the relative arrangement between the gate electrodes 124a and 124b and the drain electrodes 175a and 175b of the thin film transistor of odd-numbered pixel columns of the liquid crystal display.

The second gate signal wiring 21b and the second data signal wiring 71b include extending end portions 2b and 7b, and connecting members 3b and 8b to be connected to an external measuring tag are disposed on the extending ends 2b and 7b of the second gate signal wiring 21b and the second data signal wiring 71b.

Next, an exemplary embodiment of a method of measuring the parasitic capacitance using the first parasitic capacitance measuring unit and the second parasitic capacitance measuring unit of the liquid crystal display according to the invention will be described with reference to FIG. 4A and FIG. 4B.

In an exemplary embodiment, the pixels are disposed in the display area as shown in FIG. 2 and FIG. 3, and the first parasitic capacitance measuring unit and the second parasitic capacitance measuring unit as shown in FIG. 4A and FIG. 4B are disposed in the peripheral area.

In an exemplary embodiment, by connecting the capacitance measuring tag to the connecting members 3a and 8a of the first parasitic capacitance measuring unit, the capacitance of the first capacitor formed between the first gate capacity units 24a and the first data capacity units 75a of the first parasitic capacitance measuring unit is measured.

In such an embodiment, by connecting the capacitance measuring tag to the connecting members 3b and 8b of the second parasitic capacitance measuring unit, the capacitance of the second capacitor formed between the second gate capacity units 24b and the second data capacity units 75b of the second parasitic capacitance measuring unit is measured.

As described above, in the first parasitic capacitance measuring unit, the first data capacity units 75a are disposed at the right side of the first gate capacity units 24a, and in the second parasitic capacitance measuring unit, the second data capacity units 75b are disposed at the left side of the second gate capacity units 24b.

Accordingly, when the alignment error between the gate conductor and the data conductor of an exemplary embodiment of the liquid crystal display occurs, the capacitance of the first capacitor formed between the first gate capacity units 24a and the first data capacity units 75a of the first parasitic capacitance measuring unit and the capacitance of the second capacitor formed between the second gate capacity units 24b and the second data capacity units 75b of the second parasitic capacitance measuring unit may be different from each other.

In an exemplary embodiment, if the data conductor is misaligned in the right side with reference to the gate conductor, the overlapping area of the first gate capacity units 24a and the first data capacity units 75a of the first parasitic capacitance measuring unit is increased and the overlapping area of the second gate capacity units 24b and the second data capacity units 75b of the second parasitic capacitance measuring unit is decreased. Therefore, the capacitance of the first capacitor formed between the first gate capacity units 24a and the first data capacity units 75a of the first parasitic capacitance measuring unit becomes greater than the capacitance of the second capacitor formed between the second gate capacity units 24b and the second data capacity units 75b of the second parasitic capacitance measuring unit.

In such an embodiment, the relative arrangement of the first gate capacity units 24a and the first data capacity units 75a of the first parasitic capacitance measuring unit is substantially the same as the relative arrangement between the gate electrodes and the drain electrodes of the thin film transistors in the even-numbered pixel columns, and the relative arrangement of the second gate capacity units 24b and the second data capacity units 75b of the second parasitic capacitance measuring unit is substantially the same as the relative arrangement between the gate electrodes and the drain electrodes of the thin film transistors in the odd-numbered pixel columns.

In such an embodiment, if the capacitance of the first capacitor formed between the first gate capacity units 24a and the first data capacity units 75a of the first parasitic capacitance measuring unit is greater than the capacitance of the second capacitor formed between the second gate capacity units 24b and the second data capacity units 75b of the second parasitic capacitance measuring unit, the parasitic capacitance in the even-numbered pixel columns is greater than the parasitic capacitance in the odd-numbered pixel columns.

In an exemplary embodiment, if the data conductor is misaligned in the left side with reference to the gate conductor, the overlapping area of the first gate capacity units 24a and the first data capacity units 75a of the first parasitic capacitance measuring unit is decreased and the overlapping area of the second gate capacity units 24b and the second data capacity units 75b of the second parasitic capacitance measuring unit is increased. Therefore, the capacitance of the second capacitor formed between the second gate capacity units 24b and the second data capacity units 75b of the second parasitic capacitance measuring unit becomes greater than the capacitance of the first capacitor formed between the first gate capacity units 24a and the first data capacity units 75a of the first parasitic capacitance measuring unit.

In such an embodiment, if the capacitance of the second capacitor formed between the second gate capacity units 24b and the second data capacity units 75b of the second parasitic capacitance measuring unit is greater than the capacitance of the first capacitor formed between the first gate capacity units 24a and the first data capacity units 75a of the first parasitic capacitance measuring unit, the parasitic capacitance in the odd-numbered pixel columns is greater than the parasitic capacitance in the even-numbered pixel columns.

As described above, in an exemplary embodiment of the liquid crystal display, it may be determined whether the data conductor is misaligned in the right side or the left side with reference to the gate conductor by providing the first parasitic capacitance measuring unit and the second parasitic capacitance measuring unit in the peripheral area around the display area including the pixels PX. In such an embodiment, it may be determined which pixel column has a greater parasitic capacitance among the even-numbered pixel columns and the odd-numbered pixel columns.

Figure 5:
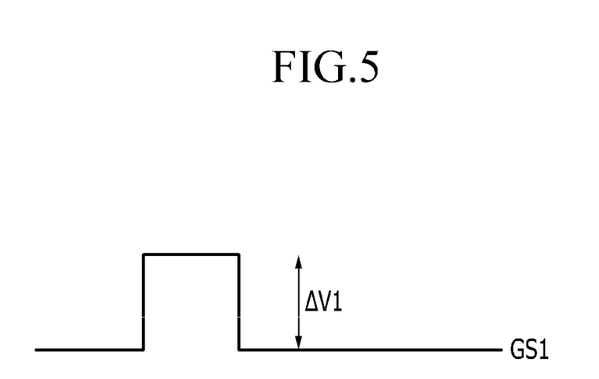
FIGS. 5 and 6 are waveform diagrams showing a signal applied to an exemplary embodiment of a liquid crystal display according to the invention.
Figure 6:
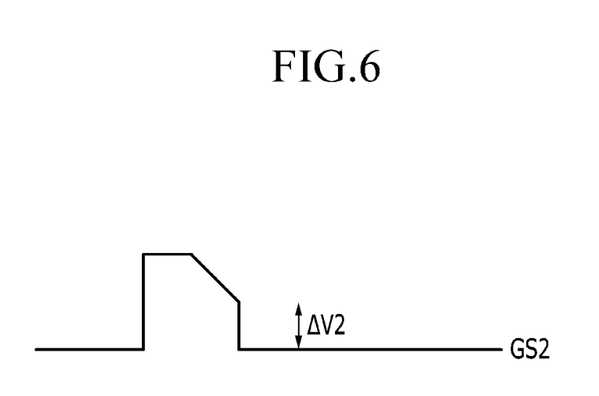

Next, referring to FIGS. 5 and 6, an exemplary embodiment of a method of compensating parasitic capacitance of a liquid crystal display according to the invention will be described. FIGS. 5 and 6 are waveform diagrams of a signal applied to an exemplary embodiment of a liquid crystal display according to the invention.

As described above, in an exemplary embodiment, if the alignment error is generated in the overlapping areas of the drain electrode 175 and the first and second gate electrodes 124a and 124b in a pixel column, a kick-back voltage formed by the data voltage applied to the pixel electrode 191, which is dropped when the first gate line 121a or the second gate line 121b is applied with the gate-off voltage Voff, may be changed such that the display deterioration such as a vertical blur or line may occur.

The kick-back voltage Vp satisfies the Equation below.

$$\Delta Vp = \frac{Cgd}{Clc + Cst + Cgd}(Von - Voff)$$

In the Equation above, Cgd denotes the parasitic capacitance formed between the first gate electrode 124a and the second gate electrode 124b connected to the gate lines 121a and 121b and the first drain electrode 175a and the second drain electrode 175b, Von-Voff denotes the difference between the gate-on voltage Von and the gate-off voltage Voff, Clc denotes the liquid crystal capacitance of the liquid crystal capacitor, and Cst denotes the storage capacitance of the storage capacitor.

The magnitude of the kick-back voltage Vp may be controlled by controlling the difference value between the gate-on voltage Von and the gate-off voltage Voff.

In an exemplary embodiment of the liquid crystal display according to the invention, the difference of the parasitic capacitance according to the overlapping area difference between the gate wire and the data wire is measured using the first parasitic capacitance measuring unit and the second parasitic capacitance measuring unit corresponding to the odd-numbered pixel columns and the even-numbered pixel columns, respectively.

Accordingly, in an exemplary embodiment, the kick-back voltage difference of the odd-numbered pixel columns and the even-numbered pixel columns may be substantially reduced or effectively removed by controlling the voltage difference between the gate-on voltage Von and the gate-off voltage Voff. Such an embodiment will now be described with reference to FIG. 5 and FIG. 6.

In an exemplary embodiment, where the data conductor is misaligned in the right side with reference to the gate conductor, the overlapping area of the first gate capacity units 24a and the first data capacity units 75a of the first parasitic capacitance measuring unit is increased and the overlapping area of the second gate capacity units 24b and the second data capacity units 75b of the second parasitic capacitance measuring unit is decreased. Therefore, the capacitance of the first capacitor formed between the first gate capacity units 24a and the first data capacity units 75a of the first parasitic capacitance measuring unit becomes greater than the capacitance of the second capacitor formed between the second gate capacity units 24b and the second data capacity units 75b of the second parasitic capacitance measuring unit.

As described above, when the capacitance of the first capacitor formed between the first gate capacity units 24a and the first data capacity units 75a of the first parasitic capacitance measuring unit is greater than the capacitance of the second capacitor formed between the second gate capacity units 24b and the second data capacity units 75b of the second parasitic capacitance measuring unit, the parasitic capacitance in the even-numbered pixel columns is greater than the parasitic capacitance in the odd-numbered pixel columns.

In such an embodiment, the odd-numbered pixel column having the relatively small parasitic capacitance between the gate conductor and the data conductor is applied with a first gate signal GS1 having a shape including a first voltage difference ΔV1 as the difference between the gate-on voltage and the gate-off voltage, as shown in FIG. 5. Here, the difference of the gate-on voltage and the gate-off voltage is the difference of the maximum voltage and the minimum voltage at the time when voltage level of the first gate signal GS1 is changed from the gate-on voltage to the gate-off voltage.

In such an embodiment, the even-numbered pixel column having the relatively large parasitic capacitance between the gate conductor and the data conductor is applied with a second gate signal GS2 having a shape including a second voltage difference ΔV2 as the difference of the gate-on voltage and the gate-off voltage, as shown in FIG. 6. Here, the difference of the gate-on voltage and the gate-off voltage is the difference of the maximum voltage and the minimum voltage at the time when the voltage level of the second gate signal GS2 is changed from the gate-on voltage to the gate-off voltage.

Referring to FIG. 5 and FIG. 6, when the gate-on voltage is initially applied, the voltage level of the gate-on voltage of the first gate signal GS1 shown in FIG. 5 is substantially the same as the voltage level of the gate-on voltage of the second gate signal GS2 shown in FIG. 6. In such an embodiment, the gate-on voltage of the first gate signal GS1 at the time when the voltage level of the first gate signal GS1 is changed from the gate-off voltage to the gate-on voltage is substantially the same as the gate-on voltage of the second gate signal GS2 at the time when the voltage level of the second gate signal GS2 is changed from the gate-off voltage to the gate-on voltage.

However, as shown in the second gate signal GS2 of FIG. 6, which is sliced, the voltage level of the gate-on voltage is gradually lowered during the gate-on voltage is applied.

Accordingly, the second voltage difference ΔV2 of the second gate signal GS2 between the gate-on voltage and the gate-off voltage at the time when the voltage level of the second gate signal GS2 is changed from the gate-on voltage to the gate-off voltage becomes the difference between the difference of the gate-on voltage and the gate-off voltage of the second gate signal GS2, which is less than the difference of the gate-on voltage and the gate-off voltage of the first gate signal GS1.

In such an embodiment, by applying the gate signal of which the difference of the gate-on voltage and the gate-off voltage is the second voltage difference ΔV2 at the time when voltage level of the gate signal is changed from the gate-on voltage to the gate-off voltage to the even numbered pixel columns having the relatively large parasitic capacitance between the gate conductor and the data conductor, the increase of the magnitude of the kick-back voltage according to the increase of the parasitic capacitance is effectively prevented.

In an exemplary embodiment, when the data conductor is misaligned in the left side with reference to the gate conductor, the overlapping area of the first gate capacity units 24a and the first data capacity units 75a of the first parasitic capacitance measuring unit is decreased and the overlapping area of the second gate capacity units 24b and the second data capacity units 75b of the second parasitic capacitance measuring unit is increased. Therefore, the capacitance of the second capacitor formed between the second gate capacity units 24b and the second data capacity units 75b of the second parasitic capacitance measuring unit becomes greater than the capacitance of the first capacitor formed between the first gate capacity units 24a and the first data capacity units 75a of the first parasitic capacitance measuring unit.

As described above, in such an embodiment, where the capacitance of the second capacitor formed between the second gate capacity units 24b and the second data capacity units 75b of the second parasitic capacitance measuring unit is greater than the capacitance of the first capacitor formed between the first gate capacity units 24a and the first data capacity units 75a of the first parasitic capacitance measuring unit, the parasitic capacitance in the odd-numbered pixel columns is greater than the parasitic capacitance in the even-numbered pixel columns.

In such an embodiment, the even-numbered pixel columns having the relatively small parasitic capacitance between the gate conductor and the data conductor are applied with the first gate signal GS1 having the first voltage difference ΔV1 as the difference between the gate-on voltage and the gate-off voltage as shown in FIG. 5. Here, the difference of the gate-on voltage and the gate-off voltage is the voltage difference at the time when voltage level of the first gate signal GS1 is changed from the gate-on voltage to the gate-off voltage.

Also, the odd-numbered pixel columns having the relatively large parasitic capacitance between the gate conductor and the data conductor is applied with of the second gate signal GS2 having the second voltage difference ΔV2 as the difference between the gate-on voltage and the gate-off voltage as shown in FIG. 6.

Referring again to FIG. 5 and FIG. 6, the voltage level of the gate-on voltages of the first gate signal GS1 and the second gate signal GS2 are the same at the time when the gate-on voltage is initially applied.

In such an embodiment, be the second gate signal GS2 which is sliced, the voltage level of t the second gate signal GS2 is changed into a lower voltage level during the gate-on voltage is applied.

Accordingly, the second voltage difference ΔV2 of the second gate signal GS2 becomes the voltage difference between the gate-on voltage and the gate-off voltage.

In such an embodiment, by applying the second gate signal GS2, of which the difference of the gate-on voltage and the gate-off voltage is the second voltage difference ΔV2, is applied to the odd-numbered pixel columns having the relatively large parasitic capacitance between the gate conductor and the data conductor, the increase of the magnitude of the kick-back voltage according to the increase of the parasitic capacitance is effectively prevented.

As described above, in an exemplary embodiment of the liquid crystal display according to the invention, the two pixel arrays are disposed between two adjacent data lines and one data line is connected to two pixel columns positioned at the left side and the right side thereof, thereby reducing the number of wires for the data lines. In such an embodiment, the parasitic capacitance measuring unit, which measures whether the parasitic capacitance difference between the gate conductor and the data conductor of a pixel column positioned at the left side and a pixel column positioned at the right side with reference to the data line occur, is provided. In such an embodiment, by controlling the difference between the gate-on voltage and the gate-off voltage in a gate signal applied to a pixel column having the relatively large parasitic capacitance, the change of the kick-back voltage according to the change of the parasitic capacitance for the pixel column is effectively prevented to remove the kick-back voltage difference between the pixel columns, thereby effectively preventing the display quality deterioration such as the vertical blur or line due to the kick-back voltage difference.

In an alternative exemplary embodiment, exemplary embodiments of the thin film transistor array panel described above may be included in various types of display device other than a liquid crystal display.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A liquid crystal display comprising:
a display area comprising:
a plurality of pixel electrodes arranged substantially in a matrix form including a plurality of pixel rows and a plurality of pixel columns;
a plurality of data lines extending substantially in a pixel column direction, wherein each data line is disposed between two adjacent pixel columns; and
a plurality of gate lines extending substantially in a pixel row direction, wherein the gate lines are in two-to-one correspondence with the pixel rows,
wherein a first data line of the data lines is disposed between a first pixel electrode and a second pixel electrode of the pixel electrodes,
wherein the first pixel electrode and the second pixel electrode are disposed in a same pixel row between a first gate line and a second gate line of the gate lines, which are adjacent to each other,
wherein the first pixel electrode is connected to a first thin film transistor comprising a first source electrode connected to the first data line, a first drain electrode opposite to the first source electrode, and a first gate electrode, and
wherein the second pixel electrode is connected to a second thin film transistor comprising a second source electrode connected to the first data line, a second drain electrode opposite to the second source electrode, and a second gate electrode; and
a peripheral area comprising:
a first parasitic capacitor capacity measuring unit comprising a plurality of first gate capacity units and a plurality of first data capacity units; and
a second parasitic capacitor capacity measuring unit comprising a plurality of second gate capacity units and a plurality of second data capacity units,
wherein a relative arrangement between the first gate capacity units and the first data capacity units is substantially the same as a relative arrangement between the first gate electrode and the first drain electrode; and
wherein a relative arrangement between the second gate capacity units and the second data capacity units is substantially the same as a relative arrangement between the second gate electrode and the second drain electrode.

2. The liquid crystal display of claim 1, wherein
the first gate capacity units and the second gate capacity units are disposed in a same layer as the gate lines, and
the first data capacity units and the second data capacity units are disposed in a same layer as the data lines.

3. The liquid crystal display of claim 2, wherein
a first gate signal is applied to the first gate electrode,
a second gate signal is applied to the second gate electrode, and
a first voltage difference between a maximum gate voltage and a minimum gate voltage of the first gate signal at the time when the voltage level of the first gate signal is changed from a gate-on voltage to a gate-off voltage is different from a second voltage difference between a maximum gate voltage and a minimum gate voltage of the second gate signal at the time when the voltage level of the second gate signal is changed from the gate-on voltage to the gate-off voltage.

4. The liquid crystal display of claim 3, wherein
the voltage level of the gate-on voltage of the first gate signal at the time when the voltage level of the first gate signal is changed from the gate-off voltage to the gate-on voltage is substantially the same as the voltage level of the gate-on voltage of the second gate signal at the time when the voltage level of the second gate signal is changed from the gate-off voltage to the gate-on voltage.

5. The liquid crystal display of claim 3, wherein
the first gate electrode and the second gate electrode are connected to the first gate line and the second gate line, respectively.

6. The liquid crystal display of claim 5, wherein
when the magnitude of a first parasitic capacitance measured at the first parasitic capacitor capacity measuring unit is less than the magnitude of a second parasitic capacitance measured at the second parasitic capacitor capacity measuring unit,
the first voltage difference of a first gate signal applied to the first gate electrode is set to be greater than the second voltage difference of the second gate signal applied to the second gate electrode.

7. The liquid crystal display of claim 6, wherein
the first gate electrode and the second gate electrode are connected to the first gate line and the second gate line, respectively.

8. The liquid crystal display of claim 3, wherein
when the magnitude of a first parasitic capacitance measured at the first parasitic capacitor capacity measuring unit is greater than the magnitude of a second parasitic capacitance measured at the second parasitic capacitor capacity measuring unit,
the first voltage difference of the first gate signal applied to the first gate electrode is set to be less than the second voltage difference of the second gate signal applied to the second gate electrode.

9. The liquid crystal display of claim 8, wherein
the first gate electrode and the second gate electrode are connected to the first gate line and the second gate line, respectively.

10. The liquid crystal display of claim 1, wherein
a first gate signal is applied to the first gate electrode,
a second gate signal is applied to the second gate electrode, and
a voltage difference between a maximum gate voltage and a minimum gate voltage of the first gate signal at the time when the voltage level of the first gate signal is changed from a gate-on voltage to a gate-off voltage is different from a voltage difference between a maximum gate voltage and a minimum gate voltage of the second gate signal at the time when the voltage level of the second gate signal is changed from the gate-on voltage to the gate-off voltage.

11. The liquid crystal display of claim 10, wherein
the voltage level of the gate-on voltage of the first gate signal at the time when the voltage level of the first gate signal is changed from the gate-off voltage to the gate-on voltage is substantially the same as the voltage level of the gate-on voltage of the second gate signal at the time when the voltage level of the second gate signal is changed from the gate-off voltage to the gate-on voltage.

12. The liquid crystal display of claim 10, wherein
the first gate electrode and the second gate electrode are connected to the first gate line and the second gate line, respectively.

13. The liquid crystal display of claim 10, wherein
when the magnitude of a first parasitic capacitance measured at the first parasitic capacitor capacity measuring unit is greater than the magnitude of a second parasitic capacitance measured at the second parasitic capacitor capacity measuring unit,
the first voltage difference of the first gate signal applied to the first gate electrode is set to be less than the second voltage difference of the second gate signal applied to the second gate electrode.

14. The liquid crystal display of claim 13, wherein
the first gate electrode and the second gate electrode are connected to the first gate line and the second gate line, respectively.

15. The liquid crystal display of claim 10, wherein
when the magnitude of a first parasitic capacitance measured at the first parasitic capacitor capacity measuring unit is less than the magnitude of a second parasitic capacitance measured at the second parasitic capacitor capacity measuring unit,
the first voltage difference of the first gate signal applied to the first gate electrode is set to be greater than the second voltage difference of the second gate signal applied to the second gate electrode.

16. The liquid crystal display of claim 15, wherein
the first gate electrode and the second gate electrode are connected to the first gate line and the second gate line, respectively.

* * * * *